United States Patent [19]

Schoenthaler et al.

[11] Patent Number: 4,622,239
[45] Date of Patent: Nov. 11, 1986

[54] METHOD AND APPARATUS FOR DISPENSING VISCOUS MATERIALS

[75] Inventors: David Schoenthaler, Lower Makefield Township, Bucks County, Pa.; Thaddeus Wojcik, Hopewell Township, Mercer County, N.J.

[73] Assignee: AT&T Technologies, Inc., Berkeley Heights, N.J.

[21] Appl. No.: 829,889

[22] Filed: Feb. 18, 1986

[51] Int. Cl.⁴ .............................................. H05K 3/22
[52] U.S. Cl. ..................................... 427/96; 118/410; 118/600; 118/694; 118/406; 427/282
[58] Field of Search ................. 427/96, 420; 118/697, 118/410, 406, 415, 411, DIG. 4, 600; 101/123

[56] References Cited

U.S. PATENT DOCUMENTS

| 3,302,564 | 2/1967 | Wilford | 118/410 |
| 3,717,121 | 2/1973 | Bruckbauer | 118/DIG. 4 |
| 4,515,297 | 5/1985 | Schoenthaler | 427/96 |
| 4,552,778 | 11/1985 | Zimmer | 118/415 |

Primary Examiner—John D. Smith
Assistant Examiner—Vi Duong Dang
Attorney, Agent, or Firm—R. B. Levy

[57] ABSTRACT

An apparatus (28) for dispensing solder paste into openings (26-26) in a stencil (24) comprises a housing (30) having a piston (60) slidably mounted therein. A manifold (70), having a successively increasing cross-sectional area, is attached to a side wall (42) of the housing for admitting a viscous material, such as solder paste therein through successively larger sized openings (76-76) so the paste is distributed evenly beneath the piston. A pair of elastomeric blades (50-50) are secured to, and depend from the housing on opposite sides of a slot (46) to contact the stencil (24). Upon the application of a fluid pressure against the piston, paste will be expelled from the slot within a working region (96) between the blades. The blades force paste into the openings in the stencil when the housing is moved thereacross.

14 Claims, 6 Drawing Figures

METHOD AND APPARATUS FOR DISPENSING VISCOUS MATERIALS

TECHNICAL FIELD

This invention relates generally to a method and apparatus for dispensing a viscous material, such as solder paste, through openings in a substrate.

BACKGROUND OF THE INVENTION

Recent advances in the field of semiconductor technology have led to the development of chip carrier packages. Chip carrier packages are generally comprised of a planar housing, having a semiconductor chip therein. Conductive members are provided on the chip carrier for bonding to metallized areas on the surface of a printed circuit board. In addition to chip carrier packages, other electronic components, such as resistors and capacitors, have been developed for mounting directly on the surface of a printed circuit board. The term surface mounted component is commonly used to generically describe any type of electronic component which is adapted for mounting on the surface of a printed circuit board.

The technique now in common use for mounting such components on the surface of a printed circuit board comprises the steps of: (a) applying a controlled amount of a bonding material, typically solder paste, on the metallized areas on the circuit board; (b) placing the component on the surface of the circuit board such that the conductive members thereof are in contact with the solder paste-coated metallized areas; and (c) heating the solder paste to bond the conductive members of the component to the metallized areas.

There are various methods by which solder paste may be deposited on the metallized pads on a printed circuit board. One approach is to use the dispensing tool described in U.S. Pat. No. 4,515,297 issued to us on May 7, 1985 and assigned to the instant assignee. The dispensing tool described in the aforesaid patent comprises a chamber into which solder paste is drawn via a vacuum. Once the chamber is filled, a piston is placed within the chamber on top of the solder paste. A pressure is applied against the piston to force the solder paste out of the chamber through a nozzle having a plurality of apertures each in registration with a separate one of the metallized areas on the printed circuit board. In order to dispense a different pattern of solder paste, the nozzle must be replaced with one having the proper arrangement of apertures, which is a time consuming process.

Solder paste can also be deposited (printed) onto metallized areas on the printed circuit board by forcing the paste through openings in a substrate (e.g., a stencil) placed in intimate contact with the circuit board. The stencil has openings therein arranged in the same pattern as metallized areas on the circuit board, so that only the metallized areas are exposed through the stencil openings. Solder paste is applied to the stencil and a squeegee blade is moved across the surface thereof to force the paste into the stencil openings and onto the metallized areas on the printed circuit board. All of the metallized areas exposed through the stencil openings can be advantageously coated with solder paste during one or two passes of the squeegee blade across the stencil.

High quality printing of solder paste onto the printed circuit board requires a consistent volume of paste to be uniformly distributed across the leading edge of the squeegee blade and a minimal volume to be distributed across the trailing edge of the blade. In the past, prior art dispensing apparatus have incorporated only one squeegee blade. After a single pass of the blade across the stencil, a quantity of paste will typically remain proximate the leading edge of the blade. Before making the next pass in the opposite direction, the blade is made to hop or jump over this quantity of paste so the paste is now distributed along the leading edge of the blade. Unfortunately, solder paste has a high viscosity and tends to stick to the blade. Thus, paste will often cling to what now becomes the trailing edge of the blade once the blade is displaced in the opposite direction during a second pass across the stencil. The result is streaking of solder paste on the stencil and an uneven deposit of solder paste on the circuit board.

To a lesser degree, the disadvantages attendant in printing of solder paste onto a substrate using a single squeegee blade are also present in printing other less viscous materials. In an effort to improve the printing of less viscous conductive inks and the like on a printed circuit board, U.S. Pat. No. 3,464,351 issued on Sept. 2, 1969 to E. G. DeHart et al. discloses an apparatus embodying a pair of squeegee blades which serve to contain the material to be printed therebetween. In practice, the material is supplied into the region between the blades from a remote source under pressure. While the DeHart et al. apparatus may be suited for materials having a moderate viscosity, substantial difficulties are likely to arise in attempting to use the apparatus to print materials having a high viscosity, such as solder paste. In order to force solder paste from a remote source into the region between the blades of DeHart et al., a very high pressure is required which can cause the solder paste to separate. Further, when the pressure is removed, there will be a long lag time before the paste forced from the region between the blades stops flowing.

Accordingly, there is a need for a technique for dispensing a highly viscous material, such as solder paste, onto a substrate.

SUMMARY OF THE INVENTION

The foregoing disadvantages are substantially overcome by the method of the present invention for dispensing a highly viscous material onto a substrate. The method is initiated by directing viscous material under pressure into a housing. Simultaneously during the flow of the viscous material into the housing, the fluctuations in the pressure of the material are compensated for. A pressure is applied gainst the viscous material to force it out from the housing through an opening therein. The viscous material forced from the housing is confined between a pair of flexible members which depend from the housing on either side of the opening so as to be in contact with the substrate. A relative motion is imparted between the substrate and the housing in opposite directions so that the elastomeric members urge the solder paste into openings in the substrate.

DETAILED DESCRIPTION

Figure 1:
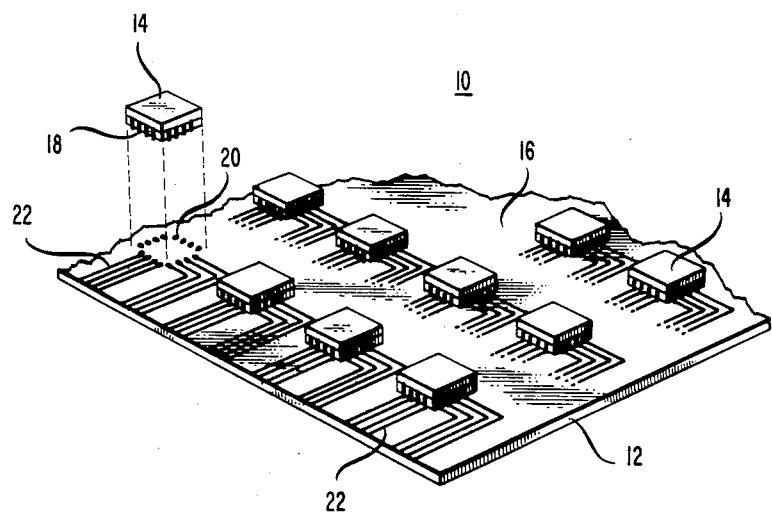
FIG. 1 is a perspective view of a prior art circuit board having chip carriers mounted therein.

FIG. 1 is a partial perspective view of a circuit package 10, according to the prior art, which is comprised of a printed circuit board 12 having a plurality of components such as chip carriers 14-14 mounted on a major surface 16 thereof. In an exemplary embodiment, each chip carrier 14 has electrically conductive pads 18-18 adapted for solder bonding to corresponding metallized areas 20-20 on the surface 16 of the circuit board 12. The metallized areas 20-20 are arranged on the surface 16 in the same pattern as the conductive pads 18-18 on the chip carriers 14-14. Metallized foils 22-22 are provided on the surface 16 to selectively interconnect the metallized areas 20-20.

To facilitate solder bonding of the pads 18-18 on the chip carriers 14-14 to the metallized areas 20-20 on the surface 16, the metallized areas are typically each coated with a layer of solder paste (not shown). When heated, the solder paste, together with whatever solder is present on the pads 18-18, melts to provide a solid electrical and mechanical bond between the pads and the metallized areas 20-20.

Figure 2:
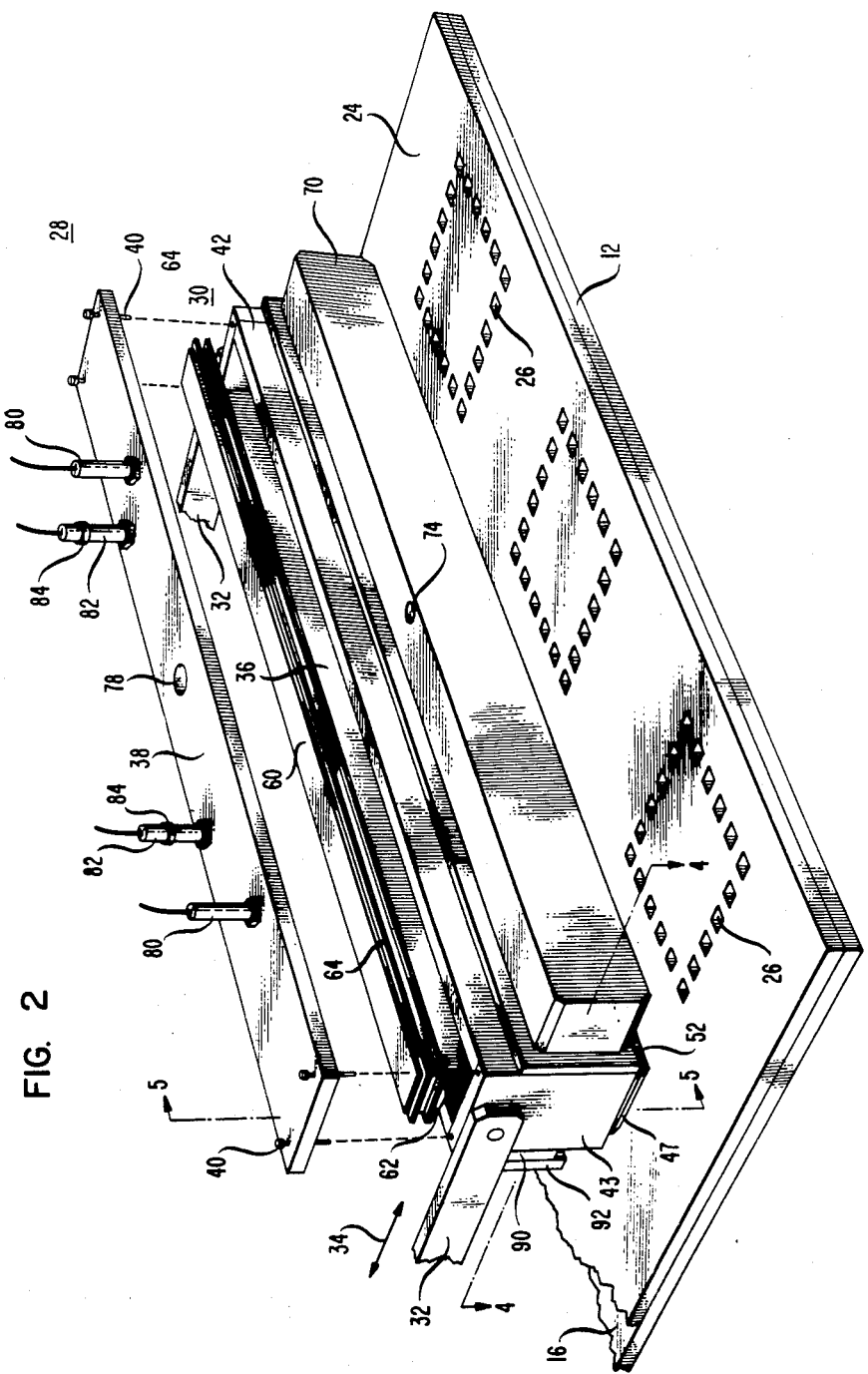
FIG. 2 is a perspective view of an apparatus, according to the present invention for applying solder paste onto the circuit board of FIG. 1.

One way in which the metallized areas 20-20 on the surface 16 can be coated with solder paste is to print the paste thereon. Referring to FIG. 2, a substrate 24, typically taking the form of a thin metal stencil having a plurality of openings 26-26 therein, is placed in intimate contact with the surface 16 of the circuit board 12. The openings 26-26 are sized on the order of, and are arranged in the same pattern as the metallized areas 20-20 (see FIG. 1) on the surface 16 so that each metallized area is exposed through a separate one of the openings in the stencil 24. Overlying the stencil 24 is a solder paste dispensing head 28, constructed in accordance with the teachings of the present invention, for forcing solder paste through the openings 26-26 and onto the metallized areas 20-20 (see FIG. 1) on the surface 16 of the circuit board 12.

The solder paste dispensing head 28 comprises a prismatic (rectangular) housing 30 attached to a pair of arms 32-32 which are connected to a mechanism (not shown) which serves to reciprocate the housing across the stencil 26 along a single axis, represented by the double-ended arrow 34. The housing 30 has an opening 36 in the top thereof which is sealed by a cover 38 secured to the top of the housing by fasteners 40-40. A gasket (not shown) is interposed between the top of the housing 30 and the cover 38 to seal the opening therebetween.

Figure 3:
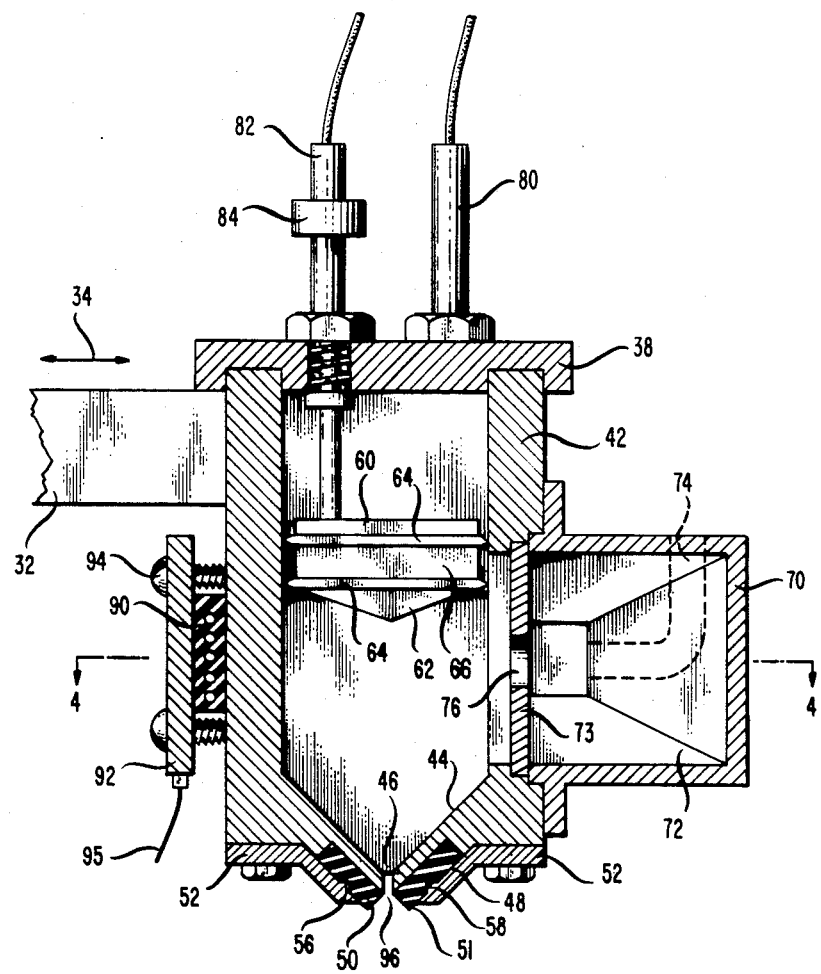
FIG. 3 is a cross-sectional end view of the apparatus of FIG. 2.
Figure 4:
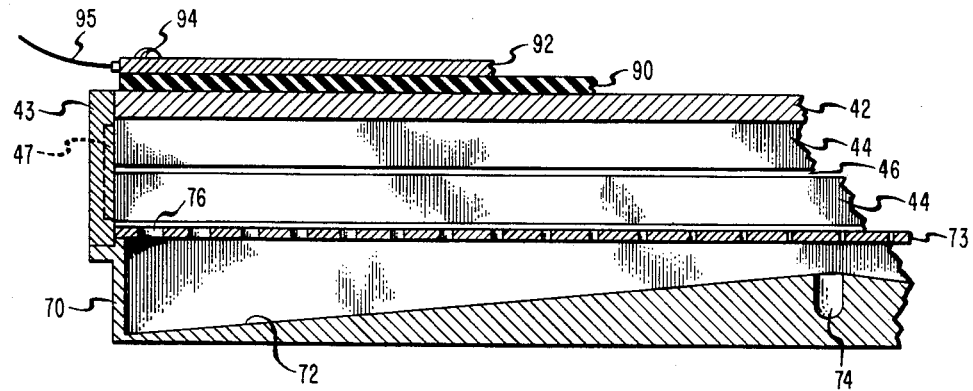
FIG. 4 is a partial plan view of the apparatus of FIG. 2 in cross-section.

Referring to FIGS. 2 and 3 the housing 30 is comprised of a pair of parallel, spaced side walls 42-42, each joined at their ends to a separate one of a pair of end walls 43-43 (FIG. 2). Each of the end walls 43-43 is pivotally attached to one of the arms 32-32 as seen in FIG. 2 thereto. Extending from the lower edge of each of the side walls 42-42, respectively, is one of a pair of inwardly and downwardly directed bottom walls 44-44, best illustrated in FIG. 3, which provide the housing 30 with a "V"-shaped bottom. The bottom walls 44-44 do not intersect because a gap or slot 46 is provided therebetween which runs the length of the side walls 42-42. Typically, the slot 46 is on the order of 0.08–0.10 inch wide. An end seal 47, best illustrated in FIGS. 2 and 4, is provided in each end wall 43 to seal the opening into each end of the slot 46.

Referring to FIG. 3, each of the bottom walls 44-44 has a pocket 48 in the lower (exposed) surface thereof in communication with the slot 46. Each of the pockets 48-48 runs horizontally the length of the side walls 42-42 and is sized to receive a separate one of a pair of bar-shaped, elastomeric squeegee blades 50-50 therein so that an edge 51 on each blade projects vertically downwardly from the pocket. The blades 50-50 are of a width slightly larger than each of the pockets 48-48 so that the spacing between the blades is less than the width of the slot 46. Although not shown, the ends of the blades 50-50 abut the end seal 47 in each of the end walls 43-43 of FIGS. 2 and 4.

The blades 50-50 are each held within a separate one of the pockets 48-48 by a separate one of a pair of clamping arms 52-52 which run along the length of the bottom walls 42-42. Each of the clamping arms 52-52 is shaped complimentary to the lower surface of a separate one of the bottom walls 44-44. The clamping arms are secured to the bottom walls 44-44 by a set of bolts 54-54 so a portion of each clamping arm overlies each pocket 48. A boss 56 runs along on each clamping arm 52 for seating in a complimentary notch 58 running in each blade 50 to assure that each blade is securely held in its corresponding pocket 48 by the clamping arm.

Referring to FIGS. 2 and 3, slidably mounted within the housing 30 is a piston 60. The piston 60 is generally prismatic in shape and has a "V"-shaped bottom 62. A pair of spaced, parallel, continuous lips 64-64, each extend horizontally outwardly from the sides and ends of the piston 60 proximate the top and bottom thereof a distance of approximately 0.06 inch thereof. The lips 64-64 on the piston 60 serve to reduce the area on the piston 60 which may contact the interior surface of the side and end walls 42-42 and 43-43, respectively, minimizing the friction therebetween. In practice, a 0.0025 inch clearance is provided all the way around between the lips 64-64 and the inside surface of the side and end walls 42-42 and 43-43, respectively.

Between the lips 64-64, there exists a U-shaped channel 66. After the piston 60 has been inserted in the housing 30, the channel 66 is filled with a fluid (not-shown), typically a commercially available wave soldering oil or grease to create a liquid/fluid seal between the housing and the piston. The sealing liquid/fluid prevents air from leaking in between the piston 60 and the side and end walls 42-42 and 43-43, respectively. To facilitate the admission of the fluid into the channel 66, small openings, in the form of notches or the like (not shown), are provided in the upper one of the lips 64-64.

Figure 5:
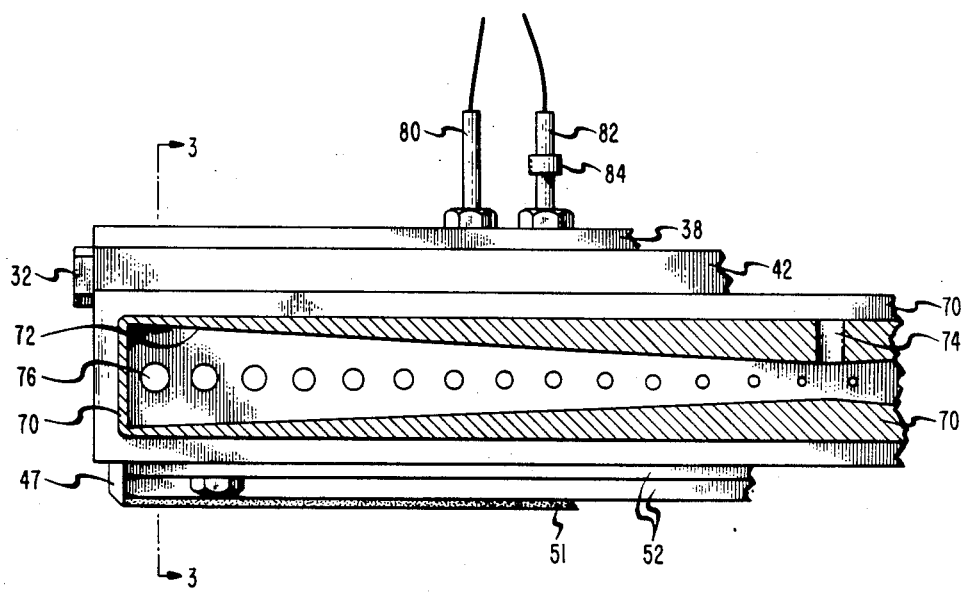
FIG. 5 is a front view of the apparatus of FIG. 2 in cross-section.

A viscous joining material (e.g., solder paste), which may have a viscosity, typically as 700,000 centipoise, is admitted into the housing 30 below the piston 60 via hollow manifold 70 attached to one of side walls 42-42 of the housing. Referring to FIGS. 4 and 5, the manifold 70 has a cavity 72 therein which progressively tapers both in height and breadth from the ends thereof towards the center, making the cavity "bow tie" in shape. Stated another way, the cavity 72 has a successively increasing cross-sectional area from the center towards the ends thereof. The cavity 72 is sealed by way of plale 73.

At the center of the manifold 70 is an inlet 74 (see FIG. 5) in communication with the cavity 72 to allow the solder paste to be admitted into the cavity at relatively high pressure (greater than 50 psi). A plurality of spaced apertures 76-76 are provided in the plate 73 so as to extend through the one side wall 42 of the housing 30 to allow the solder paste admitted into the cavity 72 to enter the housing. The apertures 76-76 are of successively increasing size from the center of the manifold 70 towards the ends thereof. The advantage of directing the viscous solder paste through the cavity 72 and into the spaced, progressively larger sized apertures 76-76 is that the pressure drop which is experienced by the solder paste during its flow is compensated for by the increasing cross-sectional area of the cavity and the progressively increasing diameter of the apertures. In this way, the solder paste evenly fills the void in the housing 30 beneath the piston 60 without voids or bubbles. To insure that the paste is admitted into the housing 30 below the piston 60, stops (not shown) may be provided on either the side or end walls 42-42 and 43-43 to prevent the piston from descending below the apertures 76-76.

Referring to FIG. 2, the cover 38 is provided with an opening 78 therein through which a fluid, such as compressed air, can be applied at a relatively low pressure (less than 15 psi), to force the piston 60 towards the bottom walls 44-44 (see FIG. 3) of the housing 30. The position of the piston 60 within the housing 30 is sensed by two pairs of proximity switches 80-80 and 82-82. Each of the proximity switches 80-80 and 82-82 of each pair is mounted to the cover 38 a short distance from one of the ends thereof. As seen in FIG. 3, each proximity switch 80 is fixedly mounted to the cover 38 so the bottom of the switch is substantially flush with the lower surface of the cover. When the piston 60 is at the top of its travel so as to be proximate the cover 38, each of the proximity switches 80-80 will be actuated thereby. Should the piston 60 be tilted so that only one end thereof is proximate the cover 38, then the proximity switch 80 closest to the tilted end of the piston will be actuated thereby.

Each of the proximity switches 82-82 is slidably mounted through the cover 38. The downward travel of each proximity switch 82 is limited by a collar 84 carried thereby. A spring 86 biases each proximity switch 82 downwardly from the cover 38 so that each proximity switch remains in contact with the piston 60 until the piston descends into the housing 30 to a height just above the apertures 76-76. While the proximity switches 82-82 remain in contact with the piston 60, the proximity switches remain actuated thereby. However, once the piston 60 has descended within housing 30, so as to be just above the apertures 76-76 of FIGS. 4 and 5, the switches 82-82 become de-actuated. If only one end of the piston 60 has descended below the lower point of travel of one of the proximity switches 82-82, then only that proximity switch will become de-actuated. By sensing the actuation state of the proximity switches 80-80 and 82-82, the relative position of the piston 60 within the housing 30 can be ascertained.

Referring to FIG. 3, a strip heater 90 runs horizontally along the side wall 42 opposite the one which mounts the manifold 70. The strip heater 90 is held against the side wall 42 by a plate 92 secured to the side wall by bolts 94-94. The strip heater 90 is controlled in response to a signal from a temperature sensor 95 (see FIG. 3) attached to the plate 92. In this way, the temperature of the solder paste within the housing 30 can be adjusted to control the paste viscosity. Thus, solder paste which normally has a high viscosity which makes the dispensing thereof very difficult, can be heated and made to flow freely to allow for easy dispensing. Once the heated solder paste is forced through the stencil openings 26-26 and onto the surface 16 of the circuit board 12, the paste cools, causing the viscosity and tackiness thereof to return to their original levels.

In operation, the housing 30 is reciprocated across the stencil 24 of FIG. 2 while at the same time a pressurized fluid is directed against the piston 60. The fluid pressure causes the piston 60 to descend in the housing 30, thereby forcing the solder paste out through the slot 46 of FIGS. 3-5 and into a working region 96 above stencil 24. The blades 50-50 serve to force the paste within the region 96 into the openings 26-26 of the stencil 24 to print the solder paste onto the circuit board 16. Once a sufficient quantity of paste has been printed onto the circuit board 16 (which is generally achieved after one or two passes of the dispensing head 28 across the stencil 24), the pressure against the piston 30 is released to terminate the dispensing of paste.

If during the operation of the dispensing head 28, the piston 60 has descended to a height just above the apertures 76-76, as sensed by the proximity switches 82-82, then solder paste can be flowed into the opening 74 in the manifold 70 to uniformly refill the housing 30 with paste. Advantageously, the refilling of the housing 30 with solder paste can be done automatically or manually without the need to remove the piston 60, providing opening 46 is sealed.

Figure 6:
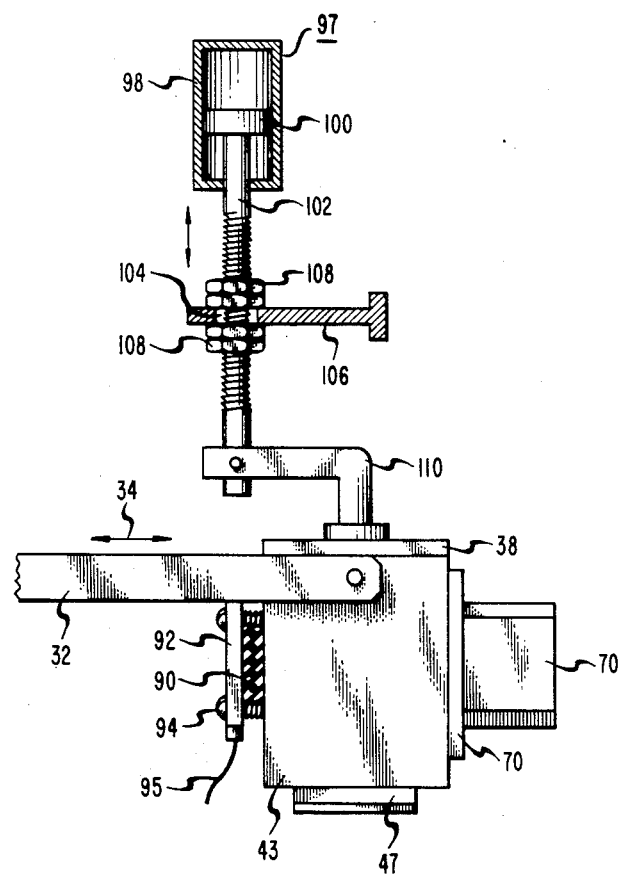
FIG. 6 is a side view of the apparatus of FIG. 2 showing a pivot mechanism therefor.

In practice, the housing 30 is held by the arms 32-32 of FIGS. 2 and 6 at a predetermined height above the stencil 24 to maintain the edge 51 of each of the blades 50-50 in substantial contact therewith. Thus, the solder paste forced from the slot 46 is confined between the blades 50-50. The confinement of the solder paste between the blades 50-50 during the dispensing thereof from the housing 30 is very advantageous because the exposure of the paste to atmospheric conditions will be reduced, thereby reducing the tendency of the paste to harden and clog before entering the openings 26-26 in the stencil 24.

Because of variations in the width and thickness of each of the blades 50-50 due to manufacturing tolerances, difficulties sometimes arise in maintaining both of the edges 51-51 of the blades in contact with the stencil 24 during reciprocation of the dispensing head 28 thereacross. As a result, solder paste may not be forced by the blades 50-50 evenly into the stencil openings 26-26 therein. One way in which this problem can be mitigated is to pivot the housing 30 about the arms 32-32 to cause a larger pressure to be applied to the trailing one of the blades 50-50 during reciprocation of the dispensing head 28 across the stencil 24. Referring to FIG. 6, there is shown an apparatus 97 for pivoting the housing 30. The apparatus 97 is comprised of a cylinder 98 which is pivotally mounted, in spaced relationship above the dispensing head 28, to the same mechanism which reciprocates the arms 32-32.

Within the cylinder 98 is a piston 100 which, when no fluid pressure is exerted thereagainst, remains spaced half-way between the top and bottom of the cylinder. The piston 100 has a threaded shaft 102 extending downwardly therefrom through the cylinder towards the housing 30. The shaft 102 passes through an opening 104 in a horizontal bar 106 attached to the mechanism which reciprocates arms 32-32. The opening 104 is of a larger diameter than the shaft 102 to permit the shaft to pass easily therethrough. A pair of nuts 108-108, of a larger diameter than the opening 104, are each threaded onto the shaft 102 above and below the bar 106. The end of the shaft 102 depending below the bar 106 is pivotally connected to one end of an "L"-shaped bracket 110. The other end of the bracket 110 is secured to the top of the cover 38.

When the nuts 108-108 are spaced apart a distance greater than the thickness of the bar 106, the shaft 102 can move up or down when pressurized fluid is admitted into the cylinder 98 below or above, respectively, the piston 100. The downward movement of the shaft 102 causes the housing 30 to pivot about the arms 32-32 in a counter-clockwise direction through a short arc, causing more pressure to be applied to the lefthand one of the blades 50-50 (not shown). Conversely, when the shaft 102 moves upwardly, the housing 30 pivots in a clockwise direction through a short arc causing more pressure to be applied to the righthand one of the blades 50-50.

The arc through which the housing 30 pivots in the counter-clockwise and clockwise directions is determined by the spacing of the upper and lower one of the nuts 108-108, respectively, from the top and bottom, respectively, of the bar 106. The greater the spacing of the upper and lower one of the nuts 108-108 from the bar 106, the greater the arc through which the housing 30 pivots in the counter-clockwise and clockwise directions, respectively. Note that the housing 30 can be prevented from pivoting altogether by threading each of the nuts 108-108 tightly against the bar 106.

The dispensing head 28 is capable of dispensing other types of viscous material in addition to solder paste. For example, the dispensing head 28 can be used to dispense viscous inks, or even RTV silicones. The sealing fluid, which is admitted into the channel 66 to obtain the liquid fluid seal between the piston 60 and the interior surface of the side and end walls 42-42 and 43-43, is chosen so as to be compatible with the type of material being dispensed.

Note that while the dispensing head 28 has been described as incorporating a piston 60, the dispensing head could be constructed without the piston. Instead, pressure, such as provided by a stream of compressed air, could be applied to the viscous material in the housing 30 to force it therefrom. However, the advantage in using the piston 60 is that the likelihood of the air being blown through the viscous material is avoided.

It is to be understood that the invention described herein is merely illustrative of the principles of the present invention. Various modifications and changes may be made thereto by persons skilled in the art which will embody the principles of the invention and fall within the spirit and scope thereof.

What is claimed is:

1. A method for dispensing viscous material through apertures in a substrate comprising the steps of:
   directing a viscous material into a housing;
   simultaneously compensating for fluctuations in the pressure of the material during the flow thereof into the housing;
   applying pressure against the viscous material to force it from the housing through an opening therein;
   confining the viscous material forced from the housing between a pair of flexible members extending from the housing on opposite sides of the opening so as to be in contact with the substrate; and
   imparting a relative motion between the substrate and the housing so that the members urge the viscous material forced from the housing through the substrate apertures.

2. The method according to claim 1 further including the step of refilling the housing with viscous material once the material reaches a predetermined level.

3. The method according to claim 2 wherein the level of the viscous material within the housing is sensed automatically.

4. The method according to claim 1 further including the step of pivoting the housing in opposite directions as the relative motion is imparted between the housing and the substrate in opposite directions to apply a greater pressure to a trailing one of the elastomeric members.

5. The method according to claim 1 further including the step of heating the viscous material admitted within said housing to control the viscosity thereof.

6. A method for dispensing viscous solder paste onto an apertured stencil in intimate contact with a printed circuit board so that the solder paste will be deposited on areas of the circuit board exposed through the apertures in the stencil comprising the steps of:
   directing solder into a housing beneath a piston slidably mounted therein;
   simultaneously compensating for fluctuations in the pressure of the material during the flow thereof into the housing;
   applying a pressure against the piston to force the solder paste out from the housing through a slot therein;
   confining the solder paste forced from the slot in the housing between a pair of flexible blades mounted to the housing on opposite sides of the opening, the blades extending from the housing toward the stencil so as to be in contact therewith; and
   moving the housing across the stencil so that the blades urge the solder paste into the apertures in the stencil and onto the areas on the circuit board in registration therewith.

7. The method according to claim 6 further including the step of refilling the housing with solder paste once the piston has descended a predetermined distance.

8. The method according to claim 7 wherein the height of the piston within the housing is sensed automatically to determine whether the piston has descended said predetermined distance.

9. The method according to claim 6 further including the step of pivoting the housing in one of two opposite directions as the housing is moved in one of two opposite directions across the substrate to apply a greater pressure to the trailing one of the blades.

10. The method according to claim 6 further including the step of heating the solder paste admitted within said housing to control the viscosity thereof.

11. An apparatus for dispensing viscous material into apertures in a substrate comprising:
   a housing having a first opening therein and a plurality of spaced second openings of successively increasing size;
   a piston slidably mounted within said housing for movement to and from said first opening;
   conduit means, having a successively increasing cross-sectional area in communication with said second openings in said housing for carrying viscous material into said housing while simultaneously compensating for fluctuations in the pressure of the viscous material during the flow thereof;

means for applying pressure against said piston to cause said piston to force the viscous material out from said first opening in said housing; and a pair of flexible members depending from the housing on opposite sides of the first opening for confining the viscous material forced from the first opening therebetween.

12. The invention according to claim 11 further including means for pivoting the housing to cause a greater pressure to be applied to one of said pair of flexible members.

13. The invention according to claim 11 further including means for heating the viscous material within the housing.

14. The invention according to claim 11 wherein each of said flexible members is prismatic in shape and has an edge thereof in contact with the substrate.

* * * * *

UNITED STATES PATENT AND TRADEMARK OFFICE
CERTIFICATE OF CORRECTION

PATENT NO.  : 4,622,239
DATED       : November 11, 1986
INVENTOR(S) : D. Schoenthaler-T. Wojcik It is certified that error appears in the above—identified patent and that said Letters Patent is hereby corrected as shown below:

On the title page, under the heading "U.S. Patent Document", insert

```
--3,464,351   9/2/69   E. G. DeHart et al.   101/126
  4,072,777   2/7/78   D. Schoenthaler       427/433--.
```

Signed and Sealed this

Twenty-eighth Day of April, 1987

Attest:

DONALD J. QUIGG

*Attesting Officer*  *Commissioner of Patents and Trademarks*